US008717809B2

(12) United States Patent
Hurkx et al.

(10) Patent No.: US 8,717,809 B2
(45) Date of Patent: May 6, 2014

(54) PHASE CHANGE MEMORY PROGRAMMING METHOD AND PHASE CHANGE MEMORY

(75) Inventors: Godferius Adrianus Maria Hurkx, Best (NL); Jesus Perez Gonzales, Ponferrada (ES)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/522,810

(22) PCT Filed: Jan. 11, 2011

(86) PCT No.: PCT/IB2011/050111
§ 371 (c)(1),
(2), (4) Date: Jul. 18, 2012

(87) PCT Pub. No.: WO2011/095902
PCT Pub. Date: Aug. 11, 2011

(65) Prior Publication Data
US 2012/0294074 A1 Nov. 22, 2012

(30) Foreign Application Priority Data
Feb. 2, 2010 (EP) .................................. 10152427

(51) Int. Cl.
*G11C 11/00* (2006.01)
(52) U.S. Cl.
USPC ...................... 365/163; 365/185.19; 365/148
(58) Field of Classification Search
CPC ........... G11C 13/0004; G11C 13/0069; G11C 2013/0078; G11C 13/0007; G11C 2013/0088; H01L 49/00
USPC ......... 365/163, 185.19, 148, 189.09, 189.011
See application file for complete search history.

(56) References Cited

U.S. PATENT DOCUMENTS

| 6,570,784 | B2 | 5/2003 | Lowrey |
| 7,502,251 | B2 * | 3/2009 | Choi et al. .................... 365/163 |
| 2007/0025144 | A1 | 2/2007 | Hsu et al. |
| 2007/0189065 | A1 | 8/2007 | Suh et al. |
| 2008/0316792 | A1 | 12/2008 | Philipp |
| 2009/0027975 | A1 | 1/2009 | Kang et al. |

FOREIGN PATENT DOCUMENTS

WO 03/085675 A2 10/2003

OTHER PUBLICATIONS

Lee, K-J. et al. "A 90 nm 1.8 V 512 Mb Diode-Switch PRAM With 266 MB/s Read Throughput,", IEEE J. of Solid-State Circuits, vol. 43, No. 1, pp. 150-62 (2008).
International Search Report for Int'l. Patent Appln. No. PCT/IB2011/050111 (Apr. 28, 2011).

* cited by examiner

*Primary Examiner* — David Lam

(57) ABSTRACT

Disclosed is a method of programming a phase change memory (100) comprising a plurality of memory cells (10), each memory cell comprising a control terminal connected to a word line (30), and a current terminal connected to a bit line (20), comprising applying a first set pulse (Vb) having a shape including a decaying trailing edge (54) to one of the bit line (20) and the word line (30) of a memory cell (10) for changing its phase change material from an amorphous phase to a crystalline phase; applying a second set pulse (Vw) to the other of the bit line and the word line of the memory cell, said second set pulse at least partially overlapping said first set pulse such that the resulting current pulse (Ids) through the memory cell exhibits the decaying trailing edge (52), said decaying trailing edge ensuring the crystallization of the phase change material; applying a first reset pulse (Vb) having said shape to one of the bit line (20) and the word line (30) of a memory cell for changing its phase change material from the crystalline phase to the amorphous phase; and applying a second reset pulse (Vw) to the other of the bit line and the word line of the memory cell, said second set pulse at least partially overlapping said first set pulse such that the resulting current pulse (Ids) through the memory cell exhibits the trailing edge of the second reset pulse. A corresponding phase change memory (100) is also disclosed.

15 Claims, 5 Drawing Sheets

PHASE CHANGE MEMORY PROGRAMMING METHOD AND PHASE CHANGE MEMORY

FIELD OF THE INVENTION

The present invention relates to a method of programming a phase change memory comprising a plurality of memory cells, each memory cell comprising a control terminal connected to a word line, and a current terminal connected to a bit line.

The present invention further relates to such a phase change memory.

BACKGROUND OF THE INVENTION

A phase change memory is a solid-state memory that comprises a material that can be switched between an amorphous structure and a crystalline structure. The structures have a different electrical resistivity, which can be translated into different bit values. Hence, during read-out of a phase change memory cell, by measuring the resistance of the cell, the bit value stored in the cell can be determined. Phase change material memories are becoming increasingly popular as they offer significant advantages in terms of cost and performance over charge storage based memory cells.

Phase change materials such as chalcogenides tend to change phase when the material reaches a certain temperature and is subsequently cooled at an appropriate speed. The amorphous phase, also referred to as the reset state, is typically formed when the material is subjected to a relatively high temperature, which will be referred to as $T_{am}$ and is the melting temperature of the crystalline phase change material followed by relatively rapid quenching, whereas the crystalline phase, also referred to as the set state, is typically formed when the amorphous material is melted at a lower temperature, which will be referred to as $T_{cr}$, followed by relatively slow quenching, which will also be referred to as a cooling step in the remainder of this application.

In order to change the phase of the phase change material in a phase change memory cell, the material is typically subjected to a current such as a source-drain current that has been carefully shaped to ensure that the material is heated to the appropriate temperature. This is typically achieved by applying appropriate pulse patterns to the bit line and word line of the memory cell, with at least one of the reset pulses, i.e. one of the pulses applied when switching the memory cell to its reset state, typically having a higher voltage than the set pulses, i.e. the pulses applied when switching the memory cell to its set state, thereby ensuring that a higher current is induced through the phase change material, thus ensuring that $T_{am}$ is reached.

Previously, rectangular pulse shapes have been used for both the set and reset pulses. However, as recognized in for instance U.S. Pat. No. 6,570,784, a problem that may occur in phase-change memory cells is that variations in the fabrication process and phase change material of the phase change memories can cause the actual temperature induced in the phase change memory cell to significantly deviate from the intended temperature. This is especially problematic when changing the phase of the phase change memory cell to the crystalline set state, as the phase change material may reach $T_{am}$, thereby erroneously keeping the material in its amorphous reset state if quenched sufficiently quickly, thus causing a data (bit) error in the memory cell.

In U.S. Pat. No. 6,570,784, this problem has been addressed by using a current pulse having a generally triangularly shaped or non-linearly shaped trailing portion in the programming of the set state, whereas the programming of the reset state is achieved using rectangularly shaped current pulses. The downward slope of the trailing portion of this pulse ensures that for memory cells that do reach $T_{am}$ during the set programming cycle, the material can cool down and recrystallize at or near $T_{cr}$. A disadvantage of this approach is that the complexity of the pulse generation circuitry is increased, due to the fact that different voltage pulses are used to generate the different current pulses.

SUMMARY OF THE INVENTION

The present invention seeks to provide an improved method of programming a phase change memory.

The present invention further seeks to provide a phase change memory having a reduced complexity.

According to a first aspect of the present invention, there is provided a method of programming a phase change memory comprising a plurality of memory cells, each memory cell comprising a control terminal connected to a word line, and a current terminal connected to a bit line, comprising applying a first set pulse having a shape including a decaying trailing edge to one of the bit line and the word line of a memory cell for changing its phase change material from an amorphous phase to a crystalline phase; applying a second set pulse to the other of the bit line and the word line of the memory cell, said second set pulse at least partially overlapping said first set pulse such that the resulting current pulse through the memory cell exhibits the decaying trailing edge, said decaying trailing edge ensuring the crystallization of the phase change material; applying a first reset pulse having said shape to one of the bit line and the word line of a memory cell for changing its phase change material from the crystalline phase to the amorphous phase; and applying a second reset pulse to the other of the bit line and the word line of the memory cell, said second set pulse at least partially overlapping said first set pulse such that the resulting current pulse through the memory cell exhibits the trailing edge of the second reset pulse.

The present invention has been based on the realization that the set pulse having a shape including a decaying trailing edge for ensuring (re-)crystallization of the phase change material during the programming cycle intended to bring the material in the crystalline phase may also be applied to the programming cycle intended to bring the material in the amorphous phase. as long as it is ensured that the shape of the current pulse through the phase change material resulting from the pulses applied to the word line and bit line of the phase change memory cell does not exhibit the decaying trailing edge portion. This is because this would cause unwanted bulk recrystallization of the phase change material, thus yielding the low-ohmic set state rather than the high-ohmic reset state. The aforementioned desired current pulse shape is achieved by ensuring that the resulting current pulse exhibits the trailing edge of the second reset pulse. Consequently, due to the fact that the first reset pulse may be applied in both the set and reset programming cycles, the pulse generation circuitry for generating the first reset pulse may also be used for generating the first set pulse, thus yielding a reduction in pulse generation circuitry complexity.

The desired current pulse shape in the reset state may be achieved in that the second set pulse and the second reset pulse have the same shape; the start of the first reset pulse is delayed compared to the start of the second reset pulse; and the start of the second set pulse is delayed compared to the first set pulse.

Alternatively, the second set pulse has a longer duration than the second reset pulse; the second set pulse is initiated at the same time as the first set pulse; and the second reset pulse is initiated at the same time as the first reset pulse. This has the advantage that the desired trailing edge can be selected simply by varying the duration of the second set/reset pulse, which further reduces the complexity of the circuitry for generating these pulses.

Preferably, the first set pulse and the first reset pulse are applied to the bit line and the second set pulse and the second reset pulse are applied to the word line. Because the bit line usually has a larger capacitance than the word line, the provision of the decaying trailing edge portion over the bit line ensures better control over the full crystallization of the phase change material in a set programming cycle.

In a preferred embodiment, the second reset pulse includes a further decaying trailing edge for setting the threshold voltage of the memory cell between a supply voltage and a read-out voltage for reading out the memory cell. It has been found by the present inventors that the application of a relatively short decay to the current pulse in the reset programming cycle has the surprising effect of lowering the threshold voltage of the memory cell in the reset state. Without wanting to be bound by theory, it is believed that a partial recrystallization of the phase change material triggered by the relatively steep trailing edge is responsible for the reduction of the threshold voltage compared to the threshold voltage of a memory cell subjected to a current pulse having a substantially vertical trailing edge, i.e. a rectangular current pulse.

The duration of the further decaying trailing edge may be approximately 20 ns, e.g. 15-25 ns. In most phase change memory cell designs, this prohibits extensive recrystallization of the phase change material, thus ensuring that the resistivity of its reset state remains substantially higher than the resistivity of its set state, whilst at the same time ensuring that the threshold voltage of the memory cell in its reset state is lowered.

Both the second reset pulse and the second set pulse may comprise the further decaying trailing edge, as the shape of the second set pulse may have any shape due to the fact that the trailing edge of the corresponding current pulse in the set programming cycle takes the shape of the first set pulse. This has the advantage that the circuitry for generating the second reset pulse and the second set pulse may be simplified due to the fact that these pulses have the same shape.

It is not necessary for the aforementioned decays to be linear. In an embodiment, at least one of the decaying trailing edge and the further decaying trailing edge exhibits a non-linear decay. As a non-linear decay may be more easily generated than a linear decay, this further reduces the complexity of the pulse generation circuitry. A further reduction in the complexity of the pulse generation circuitry may be achieved if the first reset pulse and the second reset pulse each have a symmetrical shape, and/or the first set pulse and the second set pulse each have a symmetrical shape.

In accordance with another aspect of the present invention, there is provided a phase change memory comprising a plurality of memory cells, each memory cell comprising a control terminal connected to a word line, and a current terminal connected to a bit line; first pulse generation circuitry conductively coupled to one of said bit lines and said word lines adapted to provide a first pulse having a shape including a decaying trailing edge to a memory cell for changing its phase change material from an amorphous phase to a crystalline phase during a set phase programming cycle, and for changing its phase change material from the crystalline phase to the amorphous phase during a reset phase programming cycle; second pulse generation circuitry conductively coupled to the other of said bit lines and said word lines adapted to provide a second pulse to said memory cell during said set and reset phase programming cycles; and control circuitry for controlling the first pulse generation circuitry and the second pulse generation circuitry such that the first pulse at least partially overlaps the second pulse during said set and reset phase programming cycles, with the resulting current pulse through the memory cell in the set phase programming cycle exhibiting the decaying trailing edge of the first pulse, thereby ensuring the crystallization of the phase change material, and the resulting current pulse through the memory cell in the reset phase programming cycle exhibiting the trailing edge of the second pulse.

Such a phase change memory has a reduced complexity compared to the aforementioned prior art phase change memory, which reduces the manufacturing cost of the memory.

In an embodiment, the first pulse generation circuitry is conductively coupled to the bit lines; and the second pulse generation circuitry is conductively coupled to the word lines. This has the advantage that an efficient recrystallization of the phase change material during the set programming cycle is achieved.

In a preferred embodiment, the second pulse includes a further decaying trailing edge for setting the threshold voltage of the memory cell between a supply voltage and a readout voltage for reading out the memory cell. This improves the threshold voltage of the memory cells in their reset state.

The phase change memory of the present invention may be advantageously incorporated into an apparatus such as a (portable) computer, a personal digital assistant, a mobile communications device, a digital still camera, a digital video camera and so on.

BRIEF DESCRIPTION OF THE EMBODIMENTS

Embodiments of the invention are described in more detail and by way of non-limiting examples with reference to the accompanying drawings, wherein FIG. 1 schematically depicts a phase change memory cell;

FIG. 2 schematically depicts prior art pulse shapes applied to such a phase change memory cell;

FIGS. 3 and 4 schematically depict voltage and current pulses applied to a phase change memory cell in accordance with various embodiments of the present invention;

DETAILED DESCRIPTION OF THE DRAWINGS

Figure 1:
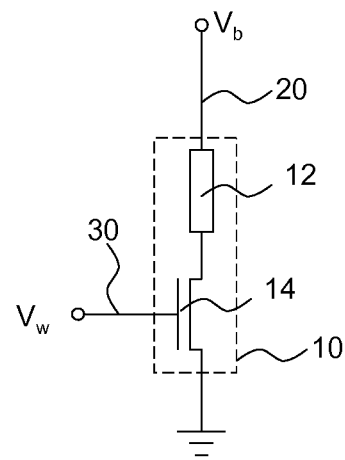

It should be understood that the Figures are merely schematic and are not drawn to scale. It should also be understood that the same reference numerals are used throughout the Figures to indicate the same or similar parts.

FIG. 1 depicts a schematic representation of a phase change memory cell 10. The phase change memory cell 10 typically comprises a phase change material acting as a variable resistor 12, with different phases of the material having different resistances. The amorphous phase typically has a higher resistance than a more crystalline phase. The variable resistor is connected between a voltage source $V_b$ and ground via a bit line 20 and a switch 14, with the control terminal, e.g. gate, of the switch 14 connected to a further voltage source $V_w$ via a word line 30.

It is emphasized that the highly schematic representation of the memory cell 10 is by way of non-limiting example only. The present invention is applicable to any suitable type of phase change memory, in which any suitable phase change material may be integrated.

During a write operation, the phase of the phase change material may be changed from an amorphous phase to a crystalline phase, which will be referred to as a set programming cycle as the memory cell 10 is set in its crystalline phase, or from a crystalline phase to an amorphous phase, which will be referred to as a reset programming cycle as the memory cell 10 is reset to its amorphous phase.

Phase change materials tend to adopt an amorphous phase upon exposure to an appropriate transition temperature $T_{am}$ and subsequent quenching as previously explained. The current pulse used during the reset programming cycle is typically short in duration and high in intensity to yield the amorphous structure. In contrast, as the recrystallization process of phase change materials takes place at a lower transition temperature $T_{cr}$, i.e. $T_{cr} < T_{am}$, and tends to take longer than the transition of a crystalline material to an amorphous phase, the current pulse used in the set programming cycle is typically longer in duration but lower in intensity to avoid overheating of the phase change material during recrystallization, as such overheating could reset the material to the amorphous phase.

Figure 2:
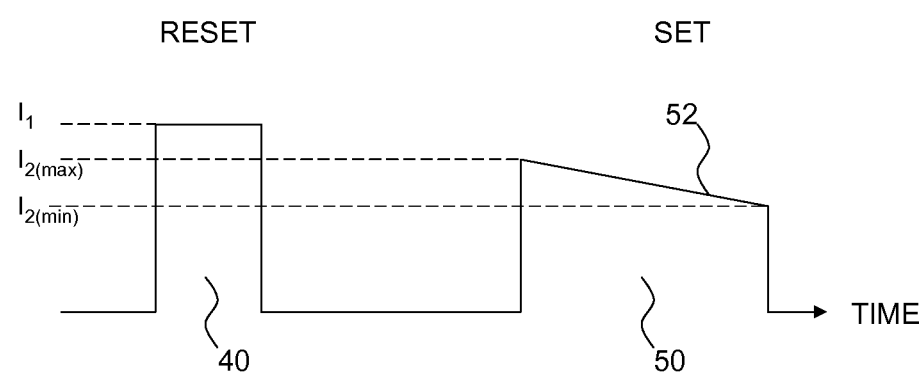

This problem is addressed in U.S. Pat. No. 6,570,784 as shown in FIG. 2. A rectangular current pulse 40 is used during the reset programming cycle, in which the current reaches a magnitude $I_1$. During the set programming cycle, a current pulse 50 is used that has a decay 52 from an initial current level $I_{2(max)}$ to a final current level $I_{2(min)}$, with $I_1 > I_{2(max)} > I_{2(min)}$. The decay 52 in the current I through the phase change material ensures that any regions of the phase change material that undesirably have adopted an amorphous structure as the result of the temperature induced by exposure of the material to current $I_{2(max)}$ will recrystallize due to the fact that the decay 52 acts as a cooling period during the set programming cycle. As previously explained, the cooling period should be sufficiently long to allow recrystallization of the phase change material, i.e. for the phase change material to reach a temperature below $T_{am}$.

A drawback of the approach disclosed in U.S. Pat. No. 6,570,784 is it is not apparent how the relatively complex shape of the current pulse 50 may be generated. In particular, due to the fact that the reset current pulse 40 and the set current pulse 50 have different shapes, the drive circuitry for providing the bit lines and word lines of the memory cells with the appropriate signals can become rather complex.

Figure 3:
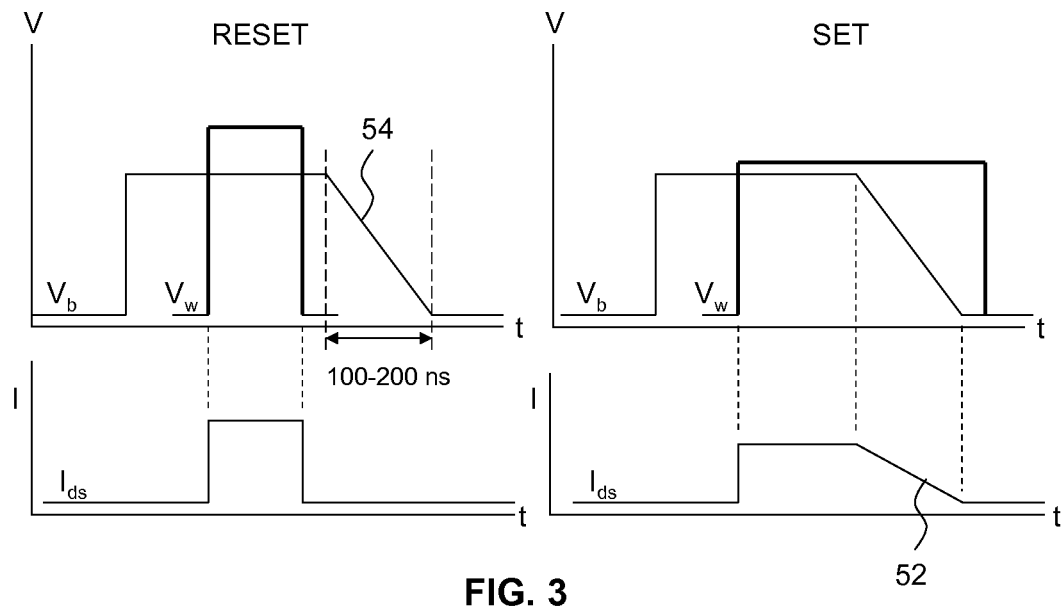

One aspect of the present invention has been based on the realization that by varying the temporal overlap between the voltage pulses supplied to the bit line 20 and the word line 30 of a phase change memory cell 10, different shape current pulses can be generated in the set and reset programming cycles with voltage pulses that have the same shape, or at least the same shape edges in both programming cycles, thus achieving different shape current pulses for the set and reset programming cycles with relatively simple pulse generation circuitry, as will be explained in more detail with the aid of FIG. 3.

As shown in FIG. 3 and in accordance with an embodiment of the method of the present invention, a voltage pulse $V_b$ is supplied to the bit line 20 of a memory cell 10 in which a trailing edge 54 has a decay in the region of 100-200 ns. This voltage pulse $V_b$ is applied in both the set and reset programming cycles. However, it should be understood that the trailing edge 54 of the voltage pulse $V_b$ should not appear in the drain-source current pulse $I_{ds}$ through the memory cell 10 in the reset programming cycle as this trailing edge 54 would lead to the unwanted recrystallization of the phase change material.

To this end, the voltage pulse $V_w$ applied to the word line 30 does not overlap with the trailing edge 54 of the bit line voltage pulse $V_b$, such that the resulting current pulse $I_{ds}$ does not exhibit the trailing edge 54 due to the fact that upon the trailing edge 54 occurring, the transistor 14 has already switched off as the voltage pulse $V_w$ on the word line 30 has already passed, i.e. the voltage on the word line 30 has reached a level such that the transistor 14 is no longer conductive.

In the set programming cycle, the shape of the leading and trailing edge of the voltage pulse $V_w$ on the word line 30 is unaltered but the duration of this pulse extended such that the trailing edge 54 of the voltage pulse $V_b$ on the bit line 20 overlaps with the voltage pulse $V_w$ on the word line 30. Consequently, the resulting current pulse $I_{ds}$ generated through the memory cell 10 includes the trailing edge 52 that allows the recrystallization of any phase change material that has adopted an amorphous phase following the leading portion of the current pulse $I_{ds}$, as explained in more detail in U.S. Pat. No. 6,570,784. In order to ensure effective recrystallization of the phase change material, the duration of the decaying edge 54 should be at least 100 ns. Preferably, the duration of the decaying edge 54 should not exceed 200 ns to ensure that the duration of the set programming cycle does not prohibit high operating speeds of the phase change memory.

It is pointed out for the sake of completeness that preferably the current pulse $I_{ds}$ in the reset programming cycle has a higher maximum current level that the current pulse $I_{ds}$ in the set programming cycle to ensure that during the reset programming cycle, the temperature of the phase change material reaches $T_{am}$, whereas the lower current level in the set programming cycle is to ensure that the phase change material reaches the lower temperature $T_{cr}$. The current level of the current pulse $I_{ds}$ may be varied in any suitable manner, e.g. by varying the voltage levels of the voltage pulses $V_b$ and/or $V_w$.

In FIG. 3, a rectangular voltage pulse $V_w$ is applied to the word line 30 in the set and reset programming cycles. However, in accordance with another aspect of the present invention, the present inventors have surprisingly found that the provision of a decaying trailing edge to the voltage pulse $V_w$ has a beneficial, i.e. lowering, effect on the threshold voltage of a transistor-based phase change memory cell 10. This is an important advantage, as the maximum threshold voltage is limited to the maximum bit line voltage that can be applied.

Figure 4:
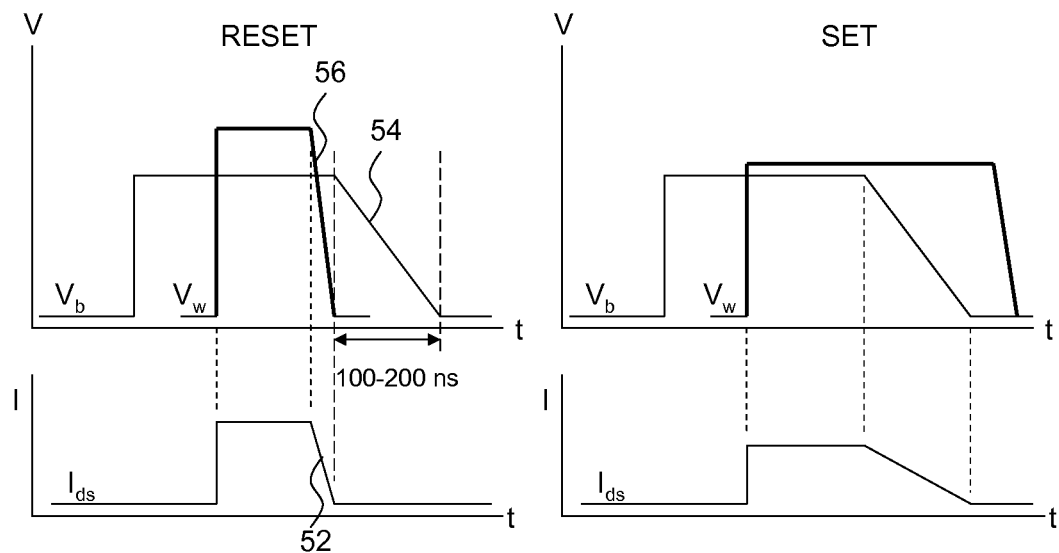

An example of a suitable set of voltage pulses and resulting current pulses is shown in FIG. 4. The voltage pulse $V_w$ also has a non-vertical decaying trailing edge that has a duration to prevent substantial recrystallization of the phase change material in the reset state, as the trailing edge of the voltage pulse $V_w$ dictates the shape of the corresponding current pulse $I_{ds}$ during the reset programming cycle.

More particularly, the trailing edge of the voltage pulse $V_w$ is to ensure that the threshold voltage $V_T$ of the memory cell 10 with its phase change material in a predominantly amorphous phase is lowered such that it is guaranteed to be lower than the supply voltage $V_{dd}$ but higher than the read-out voltage $V_R$ that is applied during reading out the memory cell 10, i.e. $V_{dd} > V_T > T_R$. The appropriate amount of fall time for the trailing edge of the word voltage pulse $V_w$ depends on the resulting amount of current that will run through the phase change material. It will be appreciated that the actual fall time of the trailing edge may therefore be set e.g. by experiment.

For instance, the duration of the trailing edge 56 may be approximately 20 ns, e.g. 15-25 ns for a current pulse $I_{ds}$ having a linear trailing edge 56 from 0.5 A to 0 A applied to e.g. a Ge-doped Sb/Te-based chalcogenide as it has been demonstrated that this interval ensures a noticeable lowering of the threshold voltage of the memory cell 10 whilst maintaining its predominantly amorphous properties, i.e. without inducing substantial recrystallization of the phase change material, although it is noted that some recrystallization does occur, which is the most likely reason for the lowering of the threshold voltage of the memory cell 10. It has however been established that this minor recrystallization does not significantly affect the resistivity of the phase change material in the reset state of the memory cell 10, such that a substantial difference between the resistivity of the set state and the reset state remains.

As can be seen in FIG. 4, the temporal overlap of the voltage pulses $V_b$ and $V_w$ is similar to the temporal overlap of these pulses in the embodiment in FIG. 3. Consequently, the resulting current pulse $I_{ds}$ has a trailing edge that is defined by the trailing edge of the voltage pulse $V_w$ in the reset programming cycle, whereas the trailing edge of the current pulse $I_{ds}$ is defined by the trailing edge of the voltage pulse $V_b$ in the set programming cycle. In other words, the trailing edge of the voltage pulse $V_w$ is encapsulated by the pulse $V_b$ in the reset programming cycle, whereas the trailing edge of the voltage pulse $V_b$ is encapsulated by the pulse $V_w$ in the set programming cycle.

Figure 5:
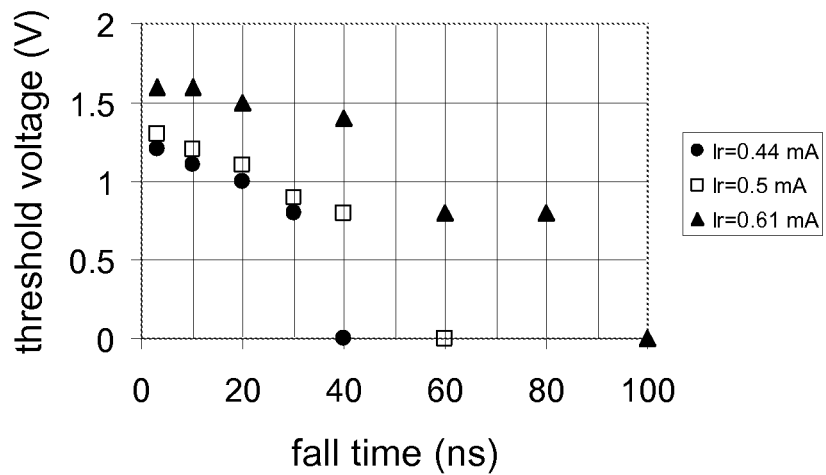
FIG. 5 depicts a graph demonstrating the effect of an inventive reset current pulse on the threshold voltage of the phase change memory cell.

FIG. 5 schematically depicts the effect of the decay time of the trailing edge of a current pulse $I_{ds}$ on the resulting threshold voltage of the memory cell 10 ns for different intensities of $I_{ds}$. The values in the graph are obtained after performing 100 consecutive reset/set programming cycles. As can be seen from FIG. 5, for decreasing intensities of $I_{ds}$, the duration of the decay of the trailing edge of this current pulse should be reduced to avoid (near-)complete recrystallization of the phase change material, which is indicated by $V_T=0V$. At present, the inventors believe that a current pulse $I_{ds}$ with a higher maximum intensity melts a larger volume of the phase change material, such that more material needs to recrystallize before reaching a significantly crystalline state with a $V_T=0V$.

Consequently, this significantly crystalline state is reached after a relatively slow cooling period if more phase change material needs to recrystallize, which would explain why the duration of the trailing edge may be increased for $I_{ds}$ pulses having an increasing maximum intensity. It should be understood that this relationship is only valid if the $I_{ds}$ pulses have a comparable maximum intensity period.

At this stage, it is pointed out that the decay of the trailing edge of the voltage pulses $V_b$ and/or $V_w$ does not need to be linear. Any suitable non-linear decay, e.g. an exponential or logarithmic decay, may be applied. In fact, it can be beneficial to use non-linear decays as these can be generated more easily, i.e. requiring less complex pulse generation circuitry, than linear decays.

Similarly, as a current pulse $I_{ds}$ may have a gradually increasing leading edge as this does not effect the phase change behavior during the reset and set programming cycles, the voltage pulses $V_b$ and/or $V_w$ may be chosen to have a symmetrical shape, which means a further reduction in the complexity of the pulse generation circuitry as the same circuit elements may be used for the generation of the leading edge and the trailing edge of these voltage pulses.

Figure 6:
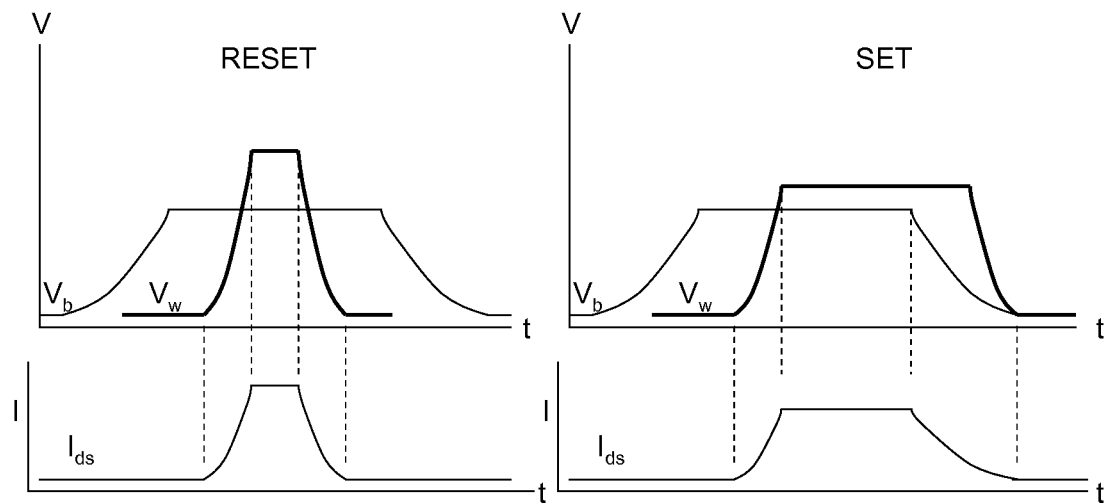
FIG. 6-8 depict voltage and current pulses applied to a phase change memory cell in accordance with further embodiments of the present invention.

An example of such an embodiment is shown in FIG. 6, in which the pulses $V_b$ and $V_w$ are symmetrical and both exhibit non-linearly decaying trailing edges, with the trailing edge of the word line voltage pulse $V_w$ decaying over a shorter period than the trailing edge of the bit line voltage pulse $V_b$, which typically decays over a period of 100-200 ns for the reasons already given above.

It should be appreciated that the overlap area between the bit line voltage pulse $V_b$ and the word line voltage pulse $V_w$ defines the amount of energy that is injected into the phase change material in the form of the resulting current pulse $I_{ds}$. For this reason, the previously described embodiments of the programming method of the present invention use different width word line voltage pulses $V_w$ in the set and reset programming modes, with the start of the voltage pulse $V_w$ being delayed with respect to the start of the bit line voltage pulse $V_b$ to ensure the correct amount of overlap between these pulses.

Figure 7:
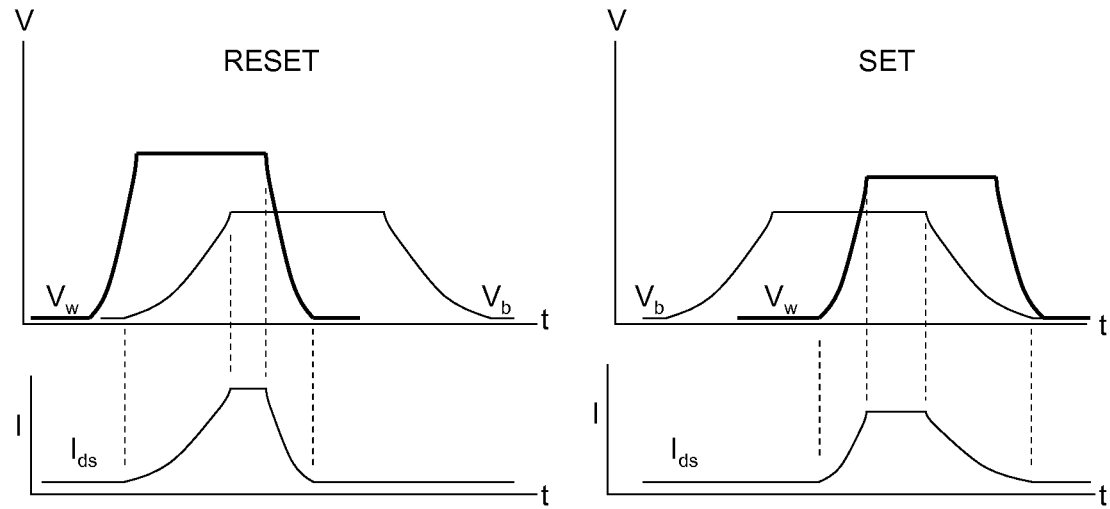
Figure 8:
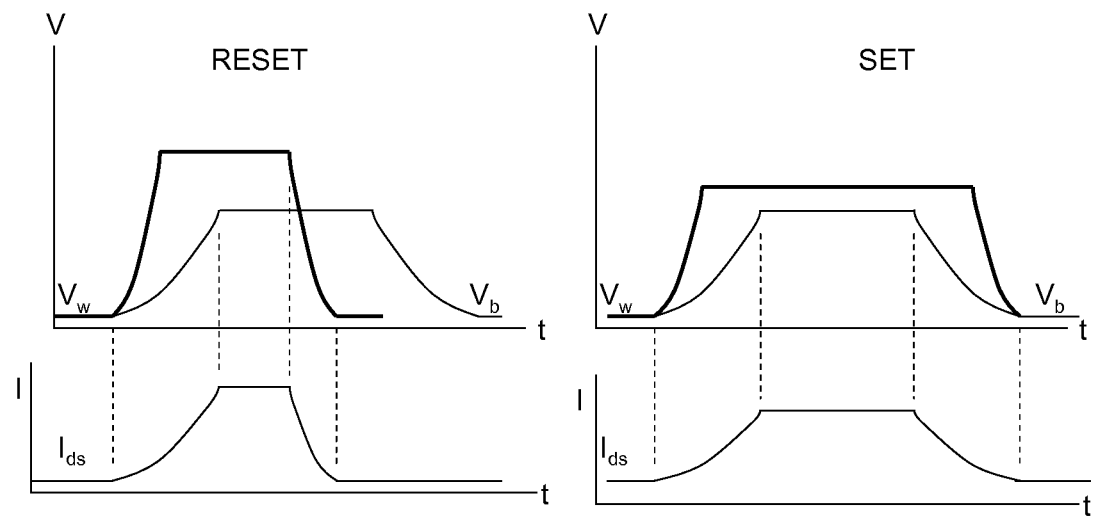

However, alternative embodiments are feasible, as for instance is shown in FIG. 7. Here, the word line voltage pulse $V_w$ has the same shape and duration in both the set and reset programming cycles, which has the advantage that the same pulse generation circuitry may be used for generating the voltage pulse $V_w$ in the set and reset programming cycles. In FIG. 8, another alternative embodiment is shown, in which the the bit line voltage pulse $V_b$ and the word line voltage pulse $V_w$ are initiated at the same time in both the set and reset programming cycles, with a longer word line pulse pulse $V_w$ being used in the set programming cycle to ensure that the decaying trailing edge of the bit lien pulse $V_b$ is incorporated in the resulting current pulse $I_{ds}$. This embodiment has the advantage of having simplified timing requirements for the generation of the voltage pulses $V_b$ and $V_w$.

As can be seen in the above described embodiments of the method of the present invention, the general concept of the programming method of the memory cell 10 may be summarized by the provision of a bit line voltage pulse $V_b$ with a trailing edge decaying over a period of 100-200 ns, which is used in both the set and reset programming cycles of the memory cell 10, with the distinction that in the set programming cycle, the decaying trailing edge is encapsulated by the word line voltage pulse $V_w$ such that the trailing edge of the resulting current pulse $I_{ds}$ takes the shape of the trailing edge of $V_b$, whereas in the reset programming cycle the trailing edge of the word line voltage pulse $V_b$ is encapsulated by the bit line voltage pulse $V_b$, such that the trailing edge of the resulting current pulse $I_{ds}$ takes the shape of the trailing edge of $V_w$.

It should be understood that in the context of the present invention, a pulse having a decaying edge is intended to cover pulse shapes in which the fall time of the pulse exceeds the fall time of a pulse that would be considered to be rectangular, as it is recognized that a perfectly rectangular pulse does not exist as there always is a non-zero transition time from a high voltage or current level to a low (zero) voltage or current level.

It should also be understood that in the above described embodiments of the method of the present invention, the voltage pulses $V_b$ may be applied to the word line 30 and the voltage pulses $V_w$ may be applied to the bit line 20 without departing from the scope of the present invention.

Figure 9:
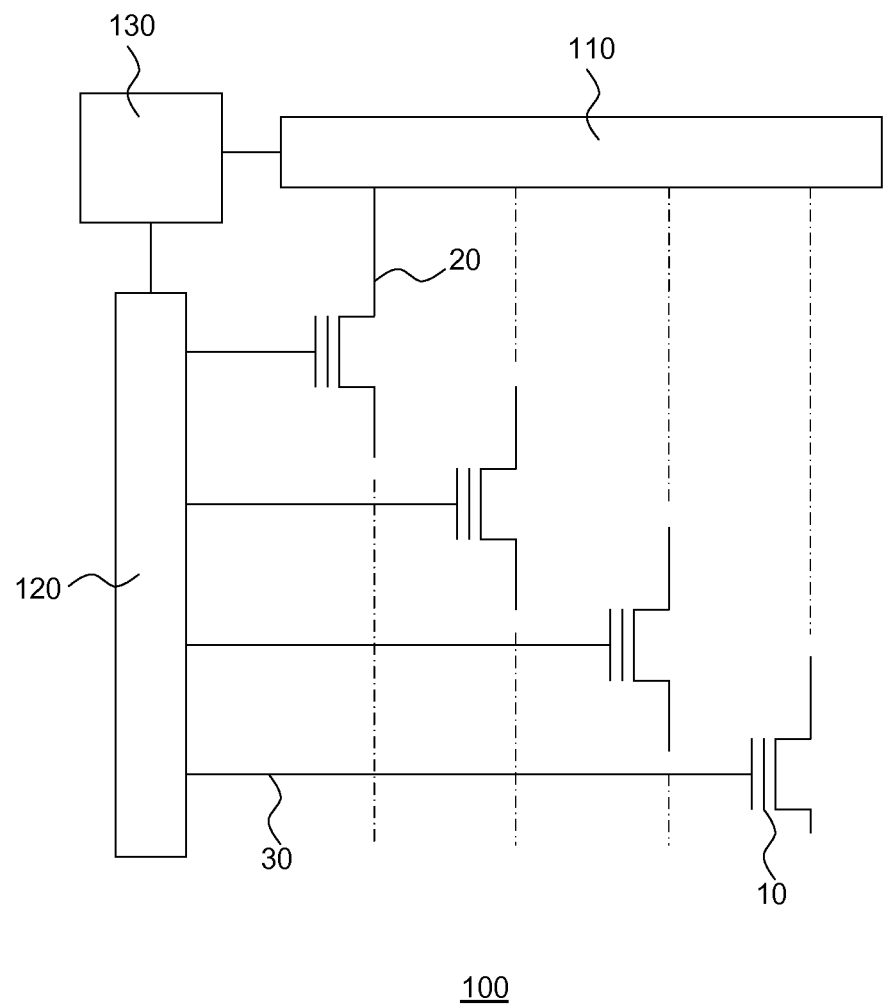
FIG. 9 depicts a phase change memory in accordance with an embodiment of the present invention.

FIG. 9 schematically depicts an embodiment of a phase change memory 100 of the present invention, which comprises a grid of memory elements 10, typically organized in rows and columns, with N groups of memory elements 10 per row of column defining the bits of a N-bit data word, with N being a positive integer, e.g. 16, 32 or 64. In such word-based memory devices 100, the word lines 30 of the group of memory cells are typically driven by the same pulse generation circuitry 120, whereas the bit lines 20 are typically driven by discrete pulse generation circuits 110. In FIG. 9, a single pulse generation circuit 110 for reasons of clarity only. It should be understood that the single pulse generation circuit 110 may comprise multiple sub-circuits for generating voltage pulses for individual memory cells 110.

In accordance with the present invention, the voltage pulse generation circuit 110 is adapted to generate one of the voltage pulses $V_b$ and $V_w$ of the present invention with the voltage pulse generation circuit 120 being adapted to generate the other of the voltage pulses $V_b$ and $V_w$ of the present invention. Preferably, the voltage pulse $V_b$ is provided to the bit line 20 of a memory cell 10 and the voltage pulse $V_w$ is provided to the word line 30 of a memory cell 10 for reasons already explained above. As the circuitry for generating the voltage pulse shapes of the present invention may be designed by the skilled person without requiring any inventive skill, a further description of the voltage pulse generation circuits 110 and 120 is omitted for reasons of brevity only.

The phase change memory 100 further comprises a control circuit 130 for ensuring that the voltage pulse generation circuits 110 and 120 generate the voltage pulses $V_b$ and $V_w$ at the correct point in time. In an embodiment, the control circuit 130 generates respective enable signals that define the respective durations of the voltage pulses $V_b$ and $V_w$.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of programming a phase change memory comprising a plurality of memory cells each having a phase change material, each memory cell comprising a control terminal connected to a word line, and a current terminal connected to a bit line, comprising:
    applying a first set pulse having a shape including a decaying trailing edge to one of the bit line and the word line of a memory cell for changing its phase change material from an amorphous phase to a crystalline phase;
    applying a second set pulse to the other of the bit line and the word line of the memory cell, said second set pulse at least partially overlapping said first set pulse such that the resulting current pulse through the memory cell exhibits the decaying trailing edge, said decaying trailing edge ensuring the crystallization of the phase change material;
    applying a first reset pulse having said shape to one of the bit line and the word line of a memory cell for changing its phase change material from the crystalline phase to the amorphous phase; and
    applying a second reset pulse to the other of the bit line and the word line of the memory cell, said second set pulse at least partially overlapping said first set pulse such that the resulting current pulse through the memory cell exhibits the trailing edge of the second reset pulse.

2. The method of claim 1, wherein the duration of the decaying trailing edge is 100-200 ns.

3. The method of claim 1, wherein:
    the second set pulse and the second reset pulse have a same shape;
    a start of the first reset pulse is delayed compared to a start of the second reset pulse; and
    the start of the second set pulse is delayed compared to the first set pulse.

4. The method of claim 1, wherein:
    the second set pulse has a longer duration than the second reset pulse;
    the second set pulse is initiated at a same time as the first set pulse; and
    the second reset pulse is initiated at a same time as the first reset pulse.

5. The method claim 1, wherein the first set pulse and the first reset pulse are applied to the bit line and the second set pulse and the second reset pulse are applied to the word line.

6. The method of claim 1, wherein the second reset pulse includes a further decaying trailing edge for setting a threshold voltage of the memory cell between a supply voltage and a read-out voltage for reading out the memory cell.

7. The method of claim 6, wherein the duration of the further decaying trailing edge is approximately 20 ns.

8. The method of claim 7, wherein the second set pulse, comprises the further decaying trailing edge.

9. The method of claim 6, wherein at least one of the decaying trailing edge and the further decaying trailing edge exhibits a non-linear decay.

10. The method of claim 1, wherein the first reset pulse and the second reset pulse each have a symmetrical shape.

11. The method of claim 1, wherein the first set pulse and the second set pulse each have a symmetrical shape.

12. A phase change memory comprising:
    a plurality of memory cells, each memory cell comprising a phase change material, a control terminal connected to a word line, and a current terminal connected to a bit line;
    first pulse generation circuitry conductively coupled to one of said bit lines and said word lines adapted to provide a first pulse having a shape including a decaying trailing edge to a memory cell for changing its phase change material from an amorphous phase to a crystalline phase during a set phase programming cycle, and for changing its phase change material from the crystalline phase to the amorphous phase during a reset phase programming cycle;
    second pulse generation circuitry conductively coupled to the other of said bit lines and said word lines adapted to provide a second pulse to said memory cell during said set and reset phase programming cycles; and
    control circuitry for controlling the first pulse generation circuitry and the second pulse generation circuitry such that the first pulse at least partially overlaps the second pulse during said set and reset phase programming cycles, with the resulting current pulse through the memory cell in the set phase programming cycle exhibiting the decaying trailing edge of the first pulse, thereby ensuring the crystallization of the phase change material, and the resulting current pulse through the memory cell in the reset phase programming cycle exhibiting the trailing edge of the second pulse.

13. The phase change memory of claim 12, wherein the first pulse generation circuitry is conductively coupled to the bit lines; and the second pulse generation circuitry is conductively coupled to the word lines.

14. The phase change memory of claim 12, wherein the second pulse includes a further decaying trailing edge for setting a threshold voltage of the memory cell between a supply voltage and a read-out voltage for reading out the memory cell.

15. An apparatus comprising the phase change memory of claim 12.

\* \* \* \* \*